United States Patent
Marsh

(10) Patent No.: US 7,052,953 B2
(45) Date of Patent: May 30, 2006

(54) DIELECTRIC MATERIAL FORMING METHODS AND ENHANCED DIELECTRIC MATERIALS

(75) Inventor: Eugene P. Marsh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/914,888

(22) Filed: Aug. 9, 2004

(65) Prior Publication Data

US 2005/0009372 A1   Jan. 13, 2005

Related U.S. Application Data

(62) Division of application No. 09/945,393, filed on Aug. 30, 2001.

(51) Int. Cl.
*H01L 21/316* (2006.01)

(52) U.S. Cl. .................... 438/240; 438/763

(58) Field of Classification Search ............ 438/253, 438/396, 240, 763, FOR. 220, FOR. 430
See application file for complete search history.

(56) References Cited

U.S. PATENT DOCUMENTS

| | | |
|---|---|---|
| 5,923,056 A | 7/1999 | Lee et al. |
| 2001/0024387 A1 | 9/2001 | Raaijmakers et al. |
| 2002/0003403 A1 | 1/2002 | Ghosh et al. |
| 2002/0012172 A1 | 1/2002 | Steinberg et al. |
| 2005/0045092 A1 | 3/2005 | Wu et al. |

OTHER PUBLICATIONS

R.F. Cava, W.F. Peck Jr., & J.J. Krajewski, "Enhancement of the dielectric constant of $Ta_2O_5$ through substitution with $TiO_2$", Nature, vol. 377, Sep. 21, 1995, pp. 215-217.

J.Y.Gan, Y.C. Chang, and T.B. Wu, "Dielectric property of $(TiO_2)_x$-$(Ta_2O_5)_{1-x}$ thin films", Applied Phys. Letters 72 (3), Jan. 19, 1998, pp. 332-334.

*Primary Examiner*—George Fourson
(74) *Attorney, Agent, or Firm*—Wells St. John P.S.

(57) ABSTRACT

A dielectric material forming method includes forming a first monolayer and forming a second monolayer on the first monolayer, one of the first and second monolayers comprising tantalum and oxygen and the other of the first and second monolayers comprising oxygen and another element different from tantalum. A dielectric layer can be formed containing the first and second monolayers. The dielectric layer can exhibit a dielectric constant greater than the first monolayer. The another element can include a Group IB to VIIIB element, such as titanium and/or zirconium. The forming of the first and second monolayer can include atomic layer depositing. A dielectric material can include first and second chemisorbed materials, the second material containing oxygen and a Group IB to VIIIB element and the dielectric material exhibiting a dielectric constant greater than the first chemisorbed material. The dielectric material can further exhibit less current leakage than the first material.

13 Claims, 5 Drawing Sheets

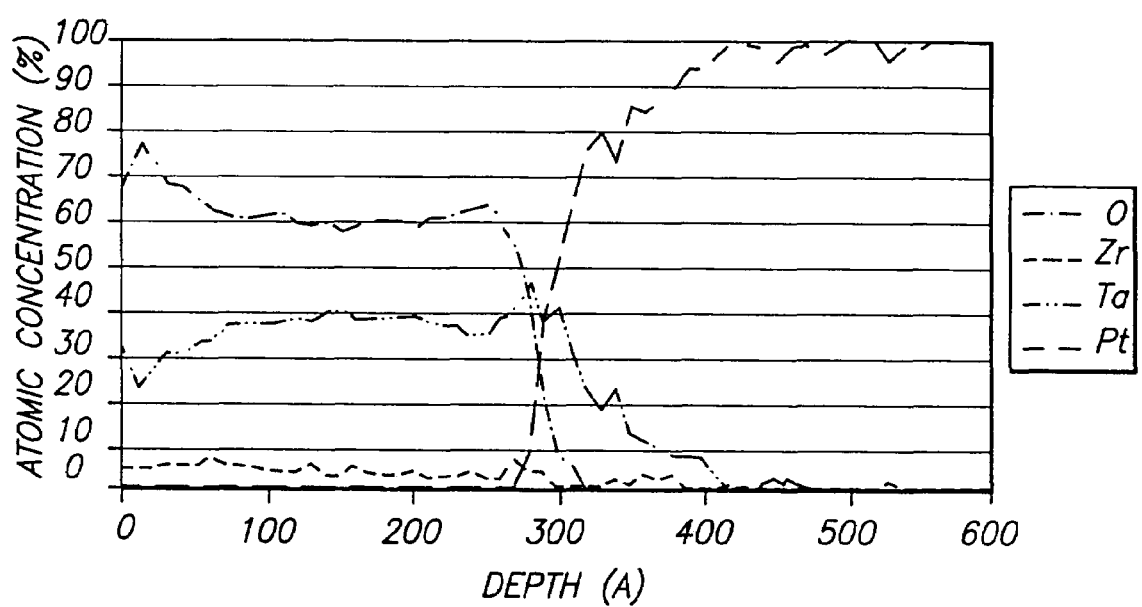

US 7,052,953 B2

DIELECTRIC MATERIAL FORMING METHODS AND ENHANCED DIELECTRIC MATERIALS

This patent resulted from a divisional application of U.S. patent application Ser. No. 09/945,393, filed on Aug. 30, 2001.

TECHNICAL FIELD

This invention relates to dielectric material forming methods and dielectric materials.

BACKGROUND OF THE INVENTION

Dielectric materials are used in a wide variety of apparatuses including, but not limited to semiconductor-based electronic devices and other electronic devices. For example, a dielectric material can form a dielectric layer in a capacitor as shown in FIG. 1. The capacitor of FIG. 1 includes a lower electrode 2 underlying a dielectric layer 4 and an upper electrode 6. Generally, a capacitor can be formed smaller and perform better when the dielectric constant "K" of dielectric layer 4 is maximized. Often, processing limitations and/or cost limitations impact the ability to provide a desirably high K. Some dielectric materials, although exhibiting a high K may suffer the disadvantage of exhibiting an unacceptable leakage current.

FIG. 2 shows an example of another device using dielectric material, namely a transistor. The transistor of FIG. 2 is formed over a substrate 8 including source and drain regions 10. A gate dielectric 14 is formed between a word line 12 and substrate 8. Wordline 12 is insulated by an overlying insulator cap 18 and side wall spacers 16. In transistors, the K of a gate dielectric might be of less concern compared to a capacitor, while leakage current may be of equal or greater concern in comparison to a capacitor.

Accordingly, improved capacitors, transistors, semiconductor-based electronic components, and other electronic components can be improved by providing improved dielectric materials.

SUMMARY OF THE INVENTION

In one aspect of the invention, a dielectric material forming method includes forming a first monolayer, forming a second monolayer on the first monolayer, and forming a dielectric layer containing the first and second monolayers. One of the first and second monolayers can contain tantalum and oxygen and the other of the first and second monolayers can contain oxygen and another element different from tantalum. The dielectric layer can exhibit a dielectric constant greater than the first monolayer. As an example, the first monolayer can contain tantalum and oxygen and may be in the form of tantalum pentoxide ($Ta_2O_5$). The another element can include a Group IB to VIIIB element. Such a dielectric material may be formed using atomic layer depositing.

In another aspect of the invention, a dielectric material forming method can include chemisorbing a first dielectric material on a substrate, chemisorbing a second dielectric material on the first material, one of the first and second materials comprising oxygen and a metal element, and forming an enhanced dielectric material containing the first and second materials. The enhanced dielectric material can exhibit a dielectric constant greater than the first dielectric material. As an example, the metal element can be a Group IB to VIIIB element, such as titanium or zirconium. Also, the one of the materials can further contain a different metal element. The enhanced dielectric material may further exhibit less current leakage than the first diectric material.

In a further aspect of the invention, an enhanced diectric layer can contain a first monolayer including tantalum and oxygen and a second monolayer including oxygen and another element. The enhanced dielectric layer can exhibit a dielectric constant greater than the first monolayer.

In yet another aspect of the invention, an enhanced dielectric material can contain first and second chemisorbed materials, the second material including oxygen and a Group IB to VIIIB element. Then enhanced dielectric material can exhibit dielectric constant greater than the first chemisorbed.

BRIEF DESCRIPTION OF THE DRAWINGS

Preferred embodiments of the invention are described below with reference to the following accompanying drawings.

FIG. 3 shows an atomic concentration depth profile of a tantalum oxide dielectric material containing titanium oxide.

FIG. 8 shows an atomic concentration depth profile of a dielectric material containing tantalum oxide and zirconium oxide.

DETAILED DESCRIPTION OF THE PREFERRED EMBODIMENTS

Figure 1:
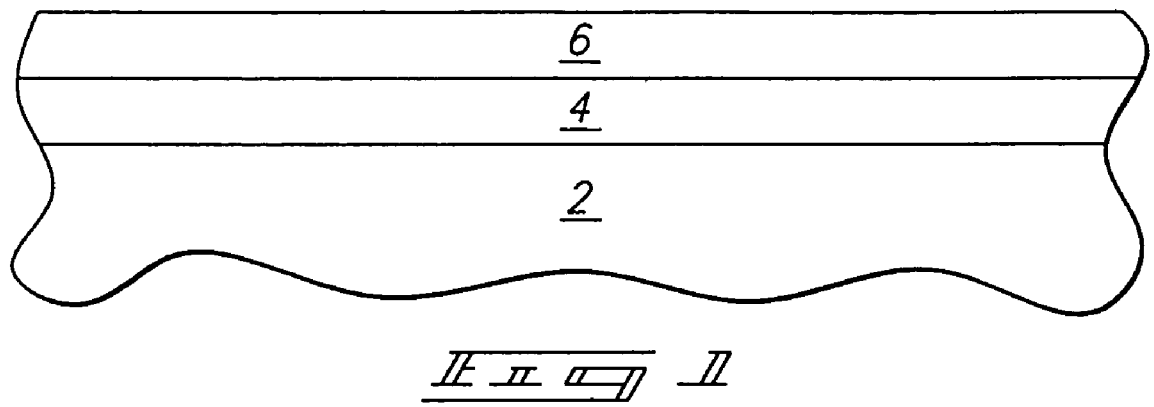
FIG. 1 shows a fragmentary, sectional view of a capacitor.
Figure 2:
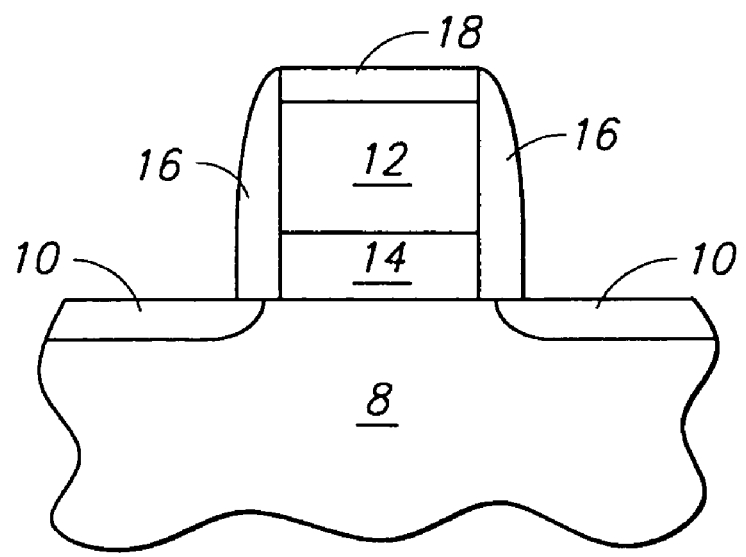
FIG. 2 shows a fragmentary, sectional view of a transistor.
Figure 2:
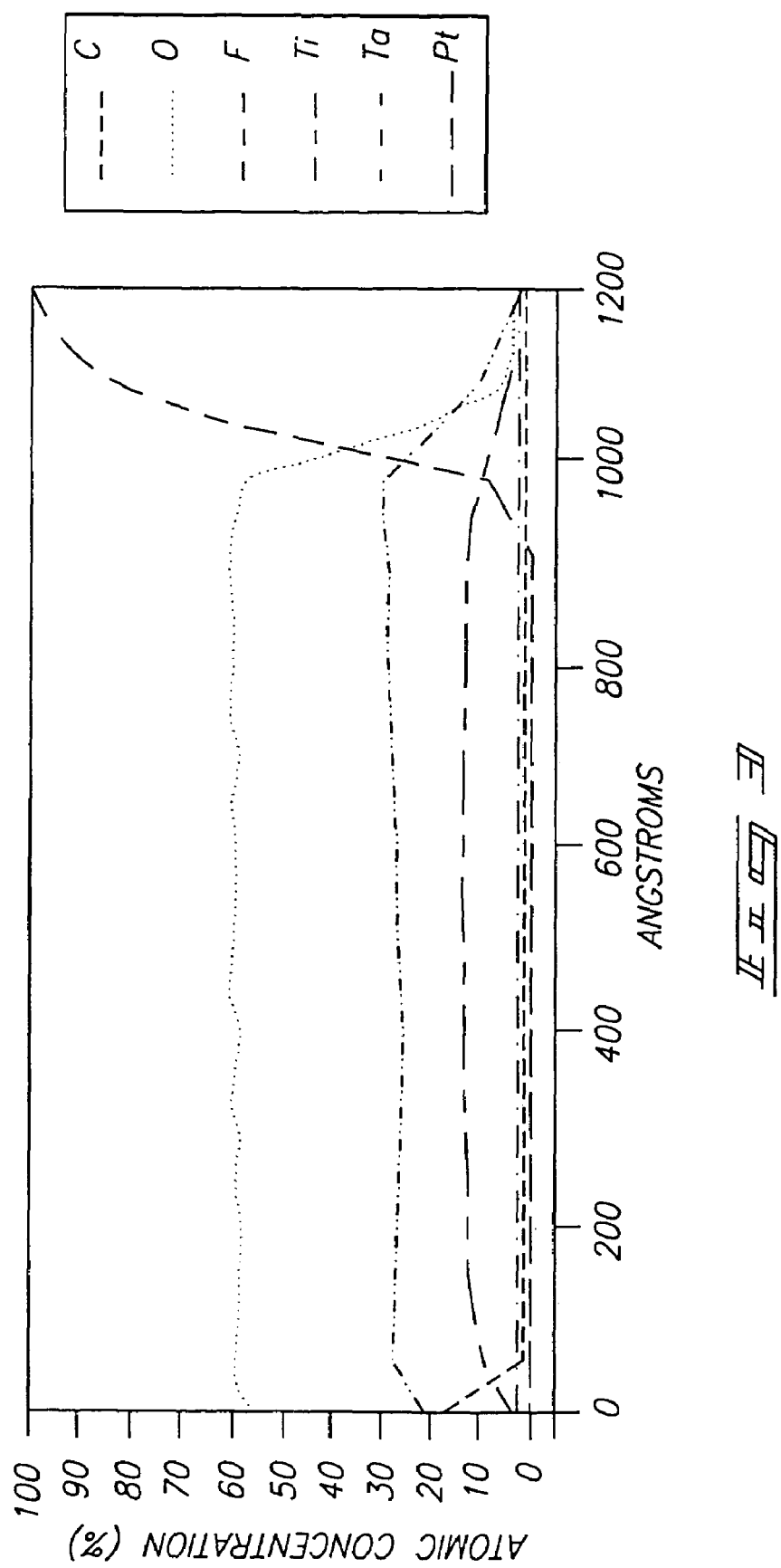

Atomic layer deposition (ALD) involves formation of successive atomic layers on a substrate. Such layers may comprise an epitaxial, polycrystalline, amorphous, etc. material. ALD may also be referred to as atomic layer epitaxy, atomic layer processing, etc. Further, the invention may encompass other deposition methods not traditionally referred to as ALD, for example, chemical vapor deposition (CVD), but nevertheless including the method steps described herein. The deposition methods herein may be described in the context of formation on a semiconductor wafer. However, the invention encompasses deposition on a variety of substrates besides semiconductor substrates.

In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of the present document, "metal" or "metal element" refers to the elements of Groups IA, IIA, and IB to VIIIB of the periodic table of the elements along with the portions of Groups IIIA to VIA designated as metals in the periodic table, namely, Al, Ga, In, Tl, Ge, Sn, Pb, Sb, Bi, and Po. The Lanthanides and Actinides are included as part of Group IIIB. "Non-metals" refers to the remaining elements of the periodic table.

Described in summary, ALD includes exposing an initial substrate to a first chemical species to accomplish chemisorption of the species onto the substrate. Theoretically, the chemisorption forms a monolayer that is uniformly one atom or molecule thick on the entire exposed initial substrate. In other words, a saturated monolayer. Practically, as further described below, chemisorption might not occur on all portions of the substrate. Nevertheless, such an imperfect monolayer is still a monolayer in the context of this document. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a contacting species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process, in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. The various aspects of the present invention described herein are applicable to any circumstance where ALD may be desired. A few examples of materials that may be deposited by ALD include titanium oxide, zirconium oxide, tantalum oxide, and others.

Often, traditional ALD occurs within an often-used range of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

The general technology of chemical vapor deposition (CVD) includes a variety of more specific processes, including, but not limited to, plasma enhanced CVD and others. CVD is commonly used to form non-selectively a complete, deposited material on a substrate. One characteristic of CVD is the simultaneous presence of multiple species in the deposition chamber that react to form the deposited material. Such condition is contrasted with the purging criteria for traditional ALD wherein a substrate is contacted with a single deposition species that chemisorbs to a substrate or previously deposited species. An ALD process regime may provide a simultaneously contacted plurality of species of a type or under conditions such that ALD chemisorption, rather than CVD reaction occurs. Instead of reacting together, the species may chemisorb to a substrate or previously deposited species, providing a surface onto which subsequent species may next chemisorb to form a complete layer of desired material.

Under most CVD conditions, deposition occurs largely independent of the composition or surface properties of an underlying substrate. By contrast, chemisorption rate in ALD might be influenced by the composition, crystalline structure, and other properties of a substrate or chemisorbed species. Other process conditions, for example, pressure and temperature, may also influence chemisorption rate. Accordingly, observation indicates that chemisorption might not occur appreciably on portions of a substrate though it occurs at a suitable rate on other portions of the same substrate. Such a condition may introduce intolerable defects into a deposited material.

ALD and other methods can be used to form dielectric materials. According to one aspect of the invention, a dielectric material forming method includes forming a first monolayer and forming a second monolayer on the first monolayer. One of the first and second monolayers can contain tantalum and oxygen and the other of the first and second monolayers can contain oxygen and another element different from tantalum. A dielectric layer can be formed containing the first and second monolayers, the dielectric layer exhibiting a dielectric constant greater than the dielectric constant of the material comprised by the first monolayer. Observation indicates that doping tantalum pentoxide ($Ta_2O_5$) with certain metal oxides during formation by ALD can significantly enhance the dielectric constant and decrease leakage current. One or more metals for the metal oxide are preferably selected from among Group IB to VIIIB elements in the Periodic Table of the Elements. More preferably, the metals are selected from among Group IVB elements. Observation indicates that titanium and zirconium can be used in a metal oxide to enhance dielectric constant, with zirconium preferred in applications where reduction of leakage current is additionally desired. Notably, applications might be identified where both titanium oxide and zirconium oxide can be beneficially doped into a dielectric material. Other Group IB to VIIIB elements might also be similarly combined.

Although the principles described herein are indicated as particularly applicable to $Ta_2O_5$ dielectric materials, the invention may be further applicable to other dielectric materials containing tantalum and oxygen, as well as dielectric materials not containing tantalum and/or oxygen. Accordingly, in another aspect of the invention, a dielectric forming method includes chemisorbing a first dielectric material on a substrate and chemisorbing a second dielectric material on the first material, one of the first and second dielectric materials comprising oxygen and a Group IB to VIIIB element. An enhanced dielectric material can be formed containing the first and second dielectric materials. The enhanced dielectric can exhibit a dielectric constant greater that of the first dielectric material.

In keeping with the broadly defined scope of ALD described herein, the chemisorbed first dielectric material and second dielectric material need not be formed as monolayers. However, preferably at least one of the first and second materials consists of a monolayer. Additionally, formation of the dielectric material is described as chemisorbing a dielectric material or forming a monolayer containing dielectric material specifically to encompass deposition methods other than ALD within the scope of the express terms used. Any formation method currently known or later developed within the scope of the described methods may be suitable to accomplish the various aspects of the inventions.

The aspects of the inventions can include formation of at least two different dielectric materials into a composite dielectric material and the different dielectric materials can be structured in a variety of ways in the composite. At one extreme, all of a first dielectric material can be formed together followed by formation of all of a second dielectric material on the first dielectric material. The first dielectric material could include a plurality of monolayers successively formed on a preceding monolayer of the first dielectric material. Similar formation of the second dielectric material could then occur on the first dielectric material.

At another extreme, a composite could be formed containing a plurality of second material monolayers approximately evenly interspersed among the first dielectric material. The first dielectric material could be formed as individual monolayers, as groupings of monolayers, or not as monolayers. For example, it is conceivable that a first dielectric material could be formed by any deposition method described herein or conventional, then followed by chemisorption of second dielectric material or formation of a monolayer of second dielectric material. Such process could be repeated creating a composite material with second material monolayers approximately evening interspersed among the first dielectric material.

In a further aspect of the invention, a dielectric material forming method can include chemisorbing alternated monolayers of a first dielectric material and a second dielectric material over a substrate. Fewer monolayers of second material can be provided compared to the first material. The first material can include tantalum and oxygen and the second material can include oxygen and at least one of a Group IVB element. Preferably from about 2% to 20% of the monolayers are second material monolayers. The method can further include approximately evenly interspersing the second material monolayers among the first material monolayers. The method can also include chemisorbing a majority of the second material monolayers on an underlying second material monolayer. Thus, the second material could occur as groups of monolayers.

According to yet another aspect of the invention, a dielectric material forming method includes atomic layer depositing an oxide of Group IVB metal on a first dielectric material containing $Ta_2O_5$ and forming a second dielectric material containing the chemisorbed oxide and the first dielectric material. As one example, the atomic layer depositing can include chemisorbing at least one Group IVB metal precursor on the first dielectric material followed by purging chemisorption byproducts and excess metal precursor from over the substrate. Exemplary precursors include tetrakis dimethyl amido titanium (TDMAT), zirconium t-butoxide, and other suitable materials as known to those skilled in the art. The metal precursors can be used alone or in combination. For example, titanium and zirconium could be deposited together. In processes where tantalum oxide is also formed by atomic layer depositing, tantalum ethoxy (Taeto) is one example of potentially several suitable precursors.

The atomic layer depositing may further include chemisorbing an oxygen precursor on the chemisorbed Group IVB metal or tantalum and purging chemisorption byproducts and excess oxygen precursor from over the substrate. A chemisorption product of the Group IVB metal precursor and the oxygen precursor can comprise Group IVB metal oxide. A chemisorption product of the tantalum precursor and the oxygen precursor can comprise a tantalum oxide, for example, $Ta_2O_5$. $H_2O$ is one example of potentially several suitable oxygen precursors. However, a more preferable oxygen precursor will be of a type that does not oxidize silicon during ALD.

In another aspect of the invention, a dielectric material forming method can include forming at least one monolayer that is a composite of the first and second dielectric materials within the one monolayer. For example, a method can include atomic layer depositing a plurality of monolayers, each of the plurality of monolayers containing both an oxide of a Group IVB metal and tantalum oxide. A dielectric material can be formed containing the Group IVB metal oxide and the tantalum oxide, the dielectric material exhibiting a dielectric constant greater than that of tantalum oxide.

Several advantages exist in forming a doped dielectric material using the methods described herein. As indicated, dielectric constant can be enhanced and leakage current can be reduced. Also, by chemisorbing small amounts of material and/or forming materials one monolayer at a time, precise control of doping can be administered. Since ALD allows for purging of chemisorption byproducts, such as organic portions of the metallorganic precursors described above, and excess metal precursor, the incorporation of carbon, fluorine, and other contaminants can be minimized. ALD and other described methods also provide for formation of very thin films of superior quality and step coverage in comparison to other methods.

Given the variety of methods described above, a variety of dielectric materials can be produced. In one aspect of the invention, an enhanced dielectric layer can include a first monolayer containing tantalum and oxygen and a second monolayer containing oxygen and another element. The enhanced dielectric layer can exhibit a dielectric constant greater than a dielectric constant of the material comprised by the first monolayer. In another aspect of the invention, an enhanced dielectric material can include first and second chemisorbed materials. The second material can contain oxygen and a Group IB to VIIIB element. The enhanced dielectric material can exhibit a dielectric constant greater than the first chemisorbed material. In a further aspect of the invention, an enhanced dielectric material can include alternated chemisorbed monolayers of a first material and a second material over a substrate. The enhanced dielectric material can contain fewer monolayers of the second material compared to the first material. The first material can contain tantalum and oxygen and the second material can contain oxygen and at least one of a Group IVB element.

As indicated above regarding methods of formation, from about 2% to about 20% of the monolayers can be second material monolayers. When the second material includes zirconium oxide or titanium oxide, from about 5% to about 15% of the monolayers can be second material monolayers or, preferably, about 8%. More specifically, when titanium oxide and zirconium oxide are together combined with $Ta_2O_5$, about 8% of the monolayers comprise titanium oxide and about 10% comprise zirconium oxide. Generally speaking, when more than one Group IB to VIIIB element is included in the enhanced dielectric material, from about 4% to about 40% of the monolayers can be monolayers comprising the metal oxides. Although the present discussion describes compositional ranges in terms of the number of monolayers, it is understood that such ranges can be converted into a corresponding weight percent range for applications where part or all of the materials are not formed as monolayers.

In one example of using ALD in an aspect of the invention, a wafer temperature can be maintained at about 180 C during deposition. Reaction chamber pressure can be maintained at about $10^{-5}$ Torr to about 1 Torr. Precursor flow rate is preferably from about 0.1 standard cubic centimeters per minute (sccm) to about 50 sccm and a duration of precursor pulses is preferably from about 0.1 second to about 10 seconds. A purge cycle can occur from about 0.1 second to about 10 seconds in duration. If the purge cycle includes injecting a purge material, flow rate can be from about 0.1 sccm to about 50 sccm.

The methods described herein are particularly suitable to forming dielectric materials having a total thickness of from about 50 to about 100 Angstroms. During ALD of monolayers, each monolayer can have a thickness of about 1 Angstrom. Accordingly, from about 50 to about 100 ALD cycles can be used. Preferably, about 90 ALD cycles are used. As an example, the 90 ALD cycles could include 81 tantalum oxide cycles and 9 titanium oxide cycles to produce a composite with 10% titanium oxide.

The described methods and materials can have a wide range of application. Accordingly, further processing may be provided that alters the structure of the dielectric material originally formed. Annealing is one example of additional processing. At sufficient temperatures known to those skilled in the art, annealing can distribute components originally formed as a discrete layer throughout a composite dielectric material such that substantial homogeneity is achieved. Accordingly, forming a composite dielectric material as described herein can merely include combining the indicated materials or can optionally include further annealing.

Turning to FIG. 3, an atomic concentration depth profile is shown obtained by X-ray Photoelectron Spectroscopy (XPS) of an approximately 1000 Angstrom thick $Ta_2O_5$ film doped with titanium oxide. The film was deposited on a platinum substrate using atomic layer deposition with Taeto, $H_2O$, and TDMAT. Of particular note in FIG. 3 is a substantially uniform concentration of titanium and tantalum throughout the film thickness. The measured uniformity occurs without annealing perhaps as a result of XPS sensitivity limitations or from component diffusion despite no annealing. Also, no carbon contamination exists except at the surface of the film thickness.

Figure 4:
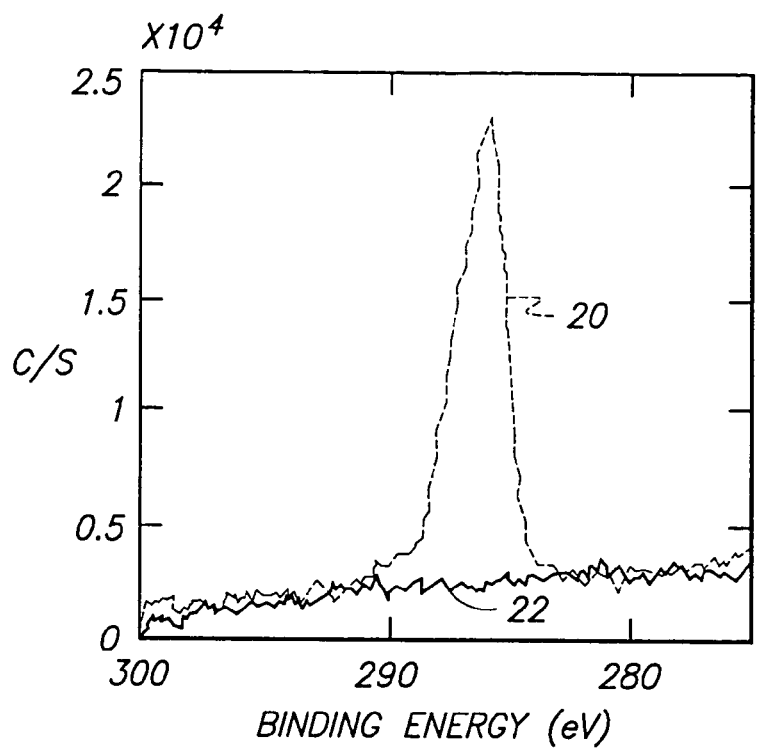
FIGS. 4–7 show spectral analyses of the surface and the bulk of the dielectric material referenced in FIG. 3.

FIG. 4 shows XPS spectral regions of the surface and in the bulk of the film analyzed to produce FIG. 3. The peak of dashed line 20 evidences the presence of is carbon orbitals at the surface while solid line 22 evidences carbon contamination below detection limits in the film bulk.

Figure 5:
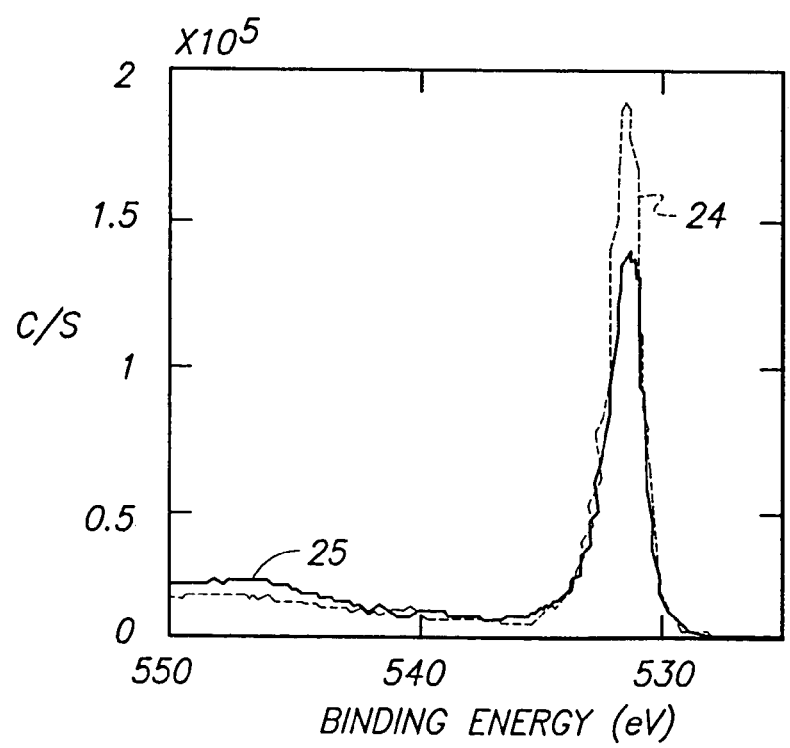

FIG. 5 shows XPS spectral regions for is oxygen orbitals at the surface by dashed line 24 and in the bulk by solid line 25.

Figure 6:
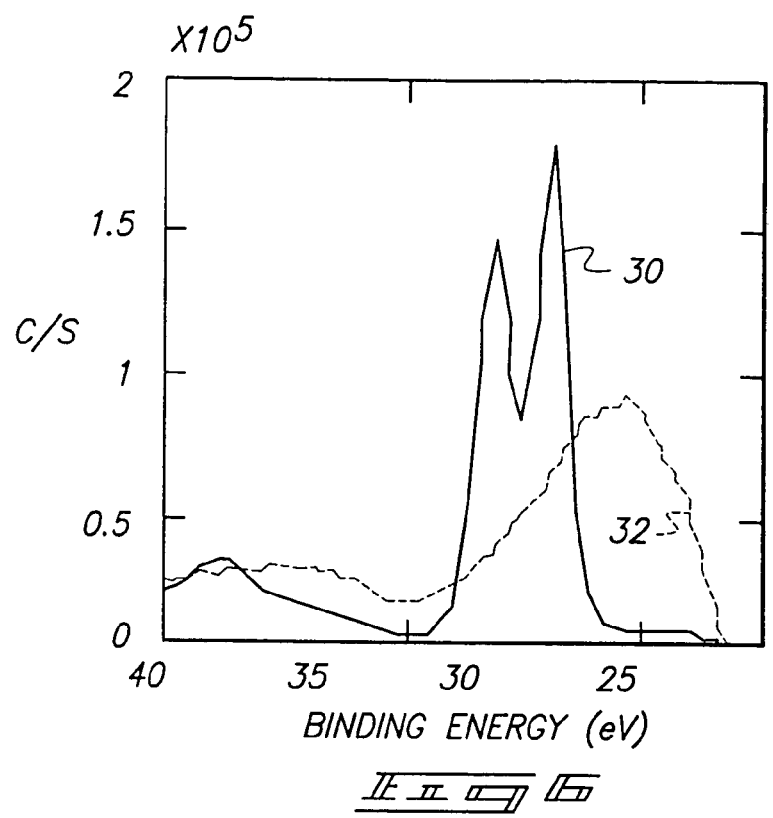

FIG. 6 shows XPS spectral regions of 4f tantalum orbitals evidencing $Ta_2O_5$ at the surface by dashed line 32. Other tantalum oxides and tantalum are evidenced in the film bulk by the two peaks of solid line 30.

Figure 7:
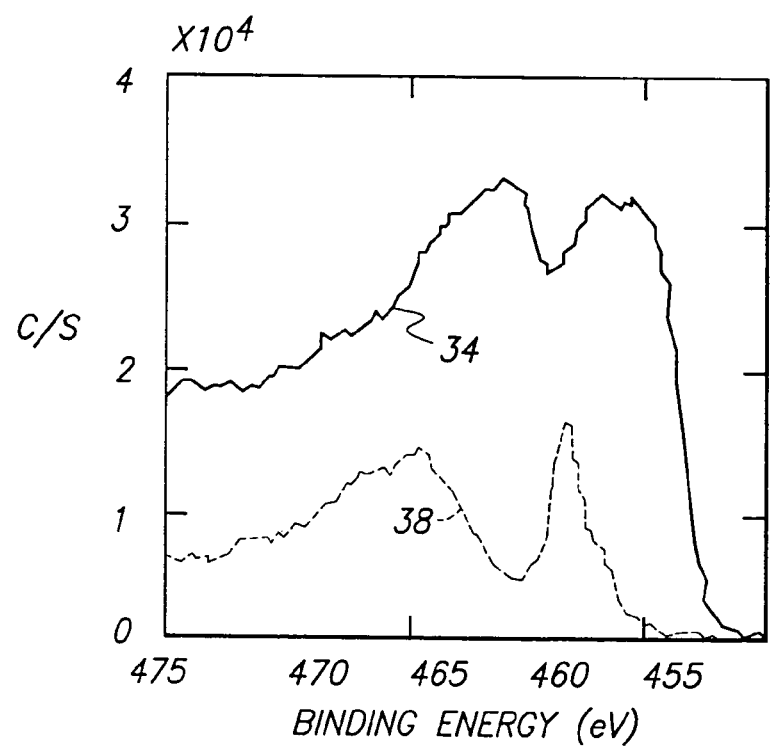

FIG. 7 shows XPS spectral regions of 2p titanium orbitals evidencing titanium and titanium oxide at the surface by the two peaks of solid line 34 and in the bulk by the two peaks of dashed line 38.

FIG. 8 shows an Auger Electron Spectroscopy (AES) atomic concentration depth profile of an approximately 300 Angstrom thick film containing tantalum oxide and zirconium oxide. The film was deposited on a platinum substrate using atomic layer deposition with Taeto, $H_2O$, and Zr(t-butoxide)$_4$. The relative amounts of Ta and Zr were controlled by setting the ratio of Taeto/$H_2O$ cycles to Zr(t-butoxide)$_4$/$H_2O$ cycles. A ratio of five Taeto/$H_2O$ cycles to one Zr(t-butoxide)$_4$/$H_2O$ cycle was used, but could be altered to increase or decrease the amount of zirconium oxide.

Using a ratio of one Taeto/$H_2O$ cycle to one Zr(t-butoxide)$_4$/$H_2O$ cycle, an approximately 500 Angstrom film (measured by SEM cross-section) was formed on a 1000 Angstrom PVD Pt bottom electrode and followed by a sputtered Pt top electrode. The planar test structure had an electrode area of $1.67 \times 10^{-2}$ square centimeters (cm$^2$) and exhibited a capacitance of 17.8 nanoFarads to yield a dielectric constant of 60. At positive polarity, the leakage current was $5.6 \times 10^{-8}$ Amperes/cm$^2$ and, at negative polarity, the leakage current was $4.7 \times 10^{-8}$ Amperes/cm$^2$.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A dielectric material forming method comprising:
    chemisorbing a first dielectric material on a substrate;
    chemisorbing a second dielectric material on the first material, one of the first and second materials consisting of oxygen, titanium, and zirconium; and
    forming an enhanced dielectric material comprising the first and second materials, the enhanced dielectric material exhibiting a dielectric constant greater than the first material.

2. The method of claim 1 wherein the first material consists of oxygen, titanium, and zirconium.

3. The method of claim 1 wherein the second material consists of oxygen, titanium, and zirconium.

4. The method of claim 3 wherein the first material comprises tantalum pentoxide.

5. The method of claim 3 wherein the first material comprises tantalum and oxygen.

6. The method of claim 1 wherein at least one of the first and second materials consists of a monolayer.

7. The method of claim 1 wherein the chemisorbing of the first or second material comprises atomic layer depositing.

8. The method of claim 1 wherein the forming of the enhanced dielectric layer comprises annealing.

9. The method of claim 1 wherein the enhanced dielectric material further exhibits less current leakage than the first dielectric material.

10. A dielectric material comprising first and second chemisorbed materials, the second material consisting of oxygen, titanium, and zirconium and the dielectric material exhibiting a dielectric constant greater than the first chemisorbed material.

11. The dielectric of claim 10 wherein the first material comprises tantalum pentoxide.

12. The dielectric of claim 10 wherein at least one of the first and second materials consists of a monolayer.

13. The dielectric of claim 10 wherein the dielectric material further exhibits less current leakage than the first dielectric material.

* * * * *

UNITED STATES PATENT AND TRADEMARK OFFICE
CERTIFICATE OF CORRECTION

PATENT NO. : 7,052,953 B2
APPLICATION NO. : 10/914888
DATED : May 30, 2006
INVENTOR(S) : Eugene P. Marsh It is certified that error appears in the above-identified patent and that said Letters Patent is hereby corrected as shown below:

Column 4, line 67
Replace "greater that of the first dielectric material."
With --greater than that of the first dielectric material.--

Column 5, line 35
Replace "material monolayers approximately evening interspersed"
With --material monolayers approximately evenly interspersed--

Column 7, line 37
Replace "(XPS) of an approximately 1000 Angstrom thick $Ta_2O_5$ film"
With --(XPS) of an approximately 1000 Angstroms thick $Ta_2O_5$ film--

Column 7, line 49
Replace "dashed line 20 evidences the presence of is carbon orbitals"
With --dashed line 20 evidences the presence of 1s carbon orbitals--

Column 7, line 52
Replace "FIG. 5 shows XPS spectral regions for is oxygen orbitals"
With --FIG. 5 shows XPS spectral regions for 1s oxygen orbitals--

Signed and Sealed this

Fifteenth Day of May, 2007

JON W. DUDAS
*Director of the United States Patent and Trademark Office*